(12) United States Patent
 Sherry

(10) Patent No.: US 11,293,968 B2
(45) Date of Patent: Apr. 5, 2022

(54) INTEGRATED CIRCUIT TESTING FOR INTEGRATED CIRCUITS WITH ANTENNAS

(71) Applicant: Johnstech International Corporation, Minneapolis, MN (US)

(72) Inventor: Jeffrey Sherry, Savage, MN (US)

(73) Assignee: JOHNSTECH INTERNATIONAL CORPORATION, Minneapolis, MN (US)

(*) Notice: Subject to any disclaimer, the term of this patent is extended or adjusted under 35 U.S.C. 154(b) by 0 days.

(21) Appl. No.: 15/930,189

(22) Filed: May 12, 2020

(65) Prior Publication Data

US 2021/0356511 A1 Nov. 18, 2021

(51) Int. Cl.
  *G01R 31/28* (2006.01)
  *H01Q 1/40* (2006.01)
  *H01Q 1/22* (2006.01)
  *G01R 31/319* (2006.01)

(52) U.S. Cl.
  CPC ... *G01R 31/2822* (2013.01); *G01R 31/31905* (2013.01); *H01Q 1/2283* (2013.01); *H01Q 1/405* (2013.01)

(58) Field of Classification Search
  CPC .......... G01R 31/2822; G01R 31/31905; H01Q 1/2283; H01Q 1/405
  See application file for complete search history.

(56) References Cited

U.S. PATENT DOCUMENTS 5,205,132 A * 4/1993 Fu ............ G01R 31/2891
  236/15 BB
6,313,651 B1 11/2001 Hembree et al.
(Continued)

FOREIGN PATENT DOCUMENTS

JP 2002-257900 A 9/2002
WO 2019/133097 A1 7/2019

OTHER PUBLICATIONS

International Search Report and Written Opinion, International Patent Application No. PCT/US2021/027207, dated Aug. 26, 2021 (10 pages).
(Continued)

*Primary Examiner* — Akm Zakaria
(74) *Attorney, Agent, or Firm* — Hamre, Schumann, Mueller & Larson, P.C.

(57) ABSTRACT

A testing system and method for testing integrated circuits with radio frequency (RF) antennas is disclosed. The system includes an alignment plate for receiving a device under test (DUT) having an RF transmitting antenna, an enclosure surrounding but separated from the transmitting antenna, a receiving antenna in a telescopic enclosure, and a conversion circuit connected to the receiving antenna. The conversion circuit is configured to convert an RF output from the DUT to a direct current (DC) voltage. The DC voltage is used as a proxy for the RF output to test the DUT. When testing chips with RF ports, the chip or ports are surrounded by the enclosure which is non-radio reflective and includes antennas for receiving RF outputs disbursed around the enclosure, or a single antenna. If multiple receiving antennas are used, sequential testing can also detect directional transmission patterns to confirm that the direction is correctly calibrated.

11 Claims, 12 Drawing Sheets

(56) References Cited

U.S. PATENT DOCUMENTS

| | | | |
|---|---|---|---|
| 6,839,029 B2* | 1/2005 | Mendolia | H01Q 1/38 |
| | | | 29/600 |
| 9,906,315 B1* | 2/2018 | Bartko | H01Q 3/04 |
| 10,114,067 B2 | 10/2018 | Lam et al. | |
| 2009/0153158 A1* | 6/2009 | Dunn | G01R 31/2822 |
| | | | 324/762.01 |
| 2009/0207036 A1 | 8/2009 | Ko et al. | |
| 2012/0100813 A1 | 4/2012 | Mow et al. | |
| 2012/0293379 A1* | 11/2012 | Nickel | G01R 31/2822 |
| | | | 343/703 |
| 2013/0093447 A1 | 4/2013 | Nickel et al. | |
| 2014/0225787 A1* | 8/2014 | Ramachandran | H01Q 9/42 |
| | | | 343/702 |
| 2015/0177277 A1* | 6/2015 | Nickel | G01R 31/3025 |
| | | | 324/629 |
| 2015/0369851 A1 | 12/2015 | Even et al. | |
| 2018/0102591 A1 | 4/2018 | Rowell et al. | |
| 2018/0364279 A1 | 12/2018 | Del Barga et al. | |
| 2019/0007002 A1* | 1/2019 | Wallis | H03F 1/523 |
| 2019/0212386 A1 | 7/2019 | Rowell et al. | |
| 2019/0310314 A1 | 10/2019 | Liu et al. | |
| 2020/0021369 A1 | 1/2020 | Huynh et al. | |
| 2020/0091608 A1 | 3/2020 | Alpman et al. | |
| 2020/0313725 A1* | 10/2020 | Abdulai | H04B 5/0031 |

OTHER PUBLICATIONS

International Search Report and Written Opinion, International Patent Application No. PCT/US2021/022137, dated Aug. 9, 2021 (12 pages).

* cited by examiner

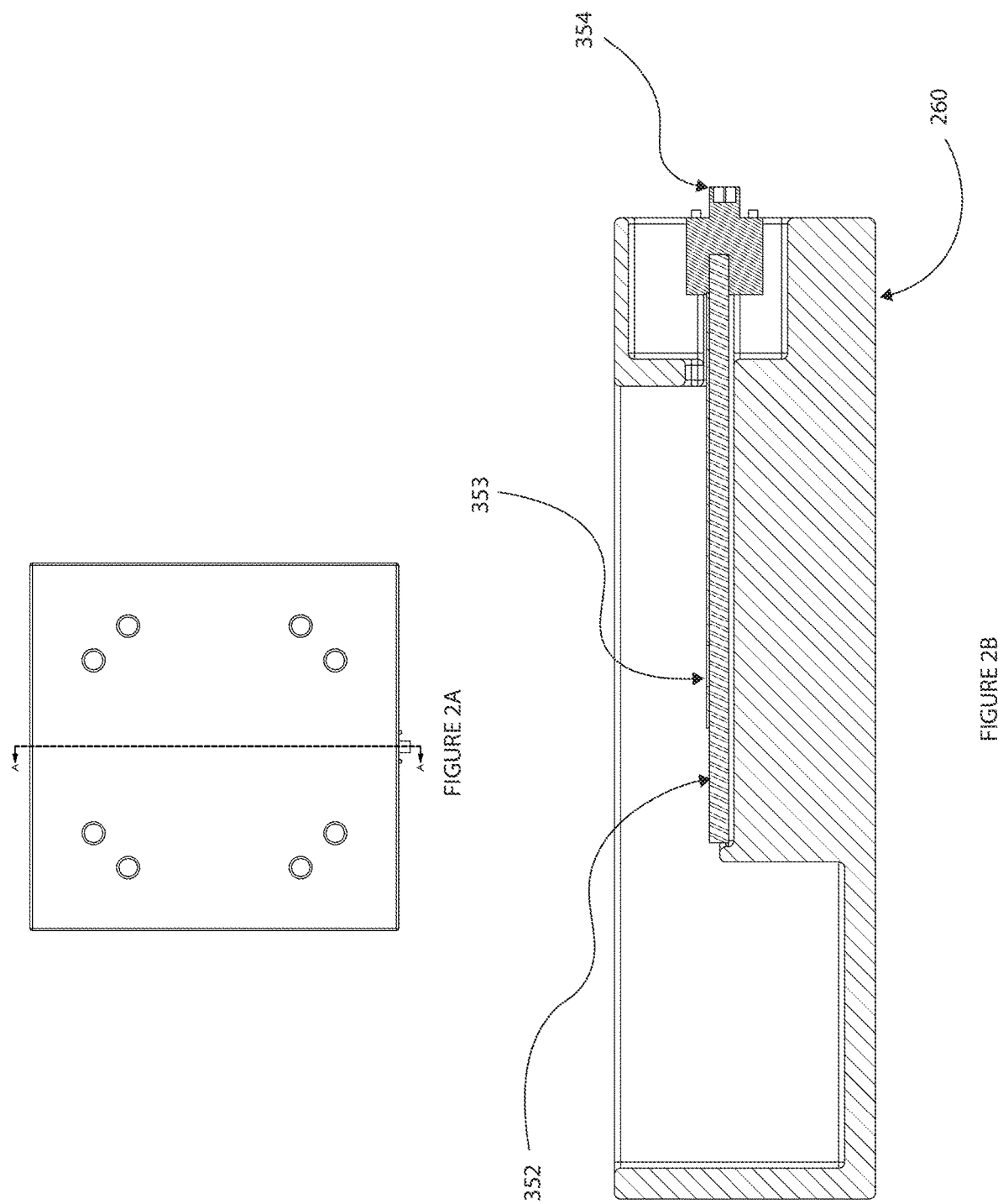

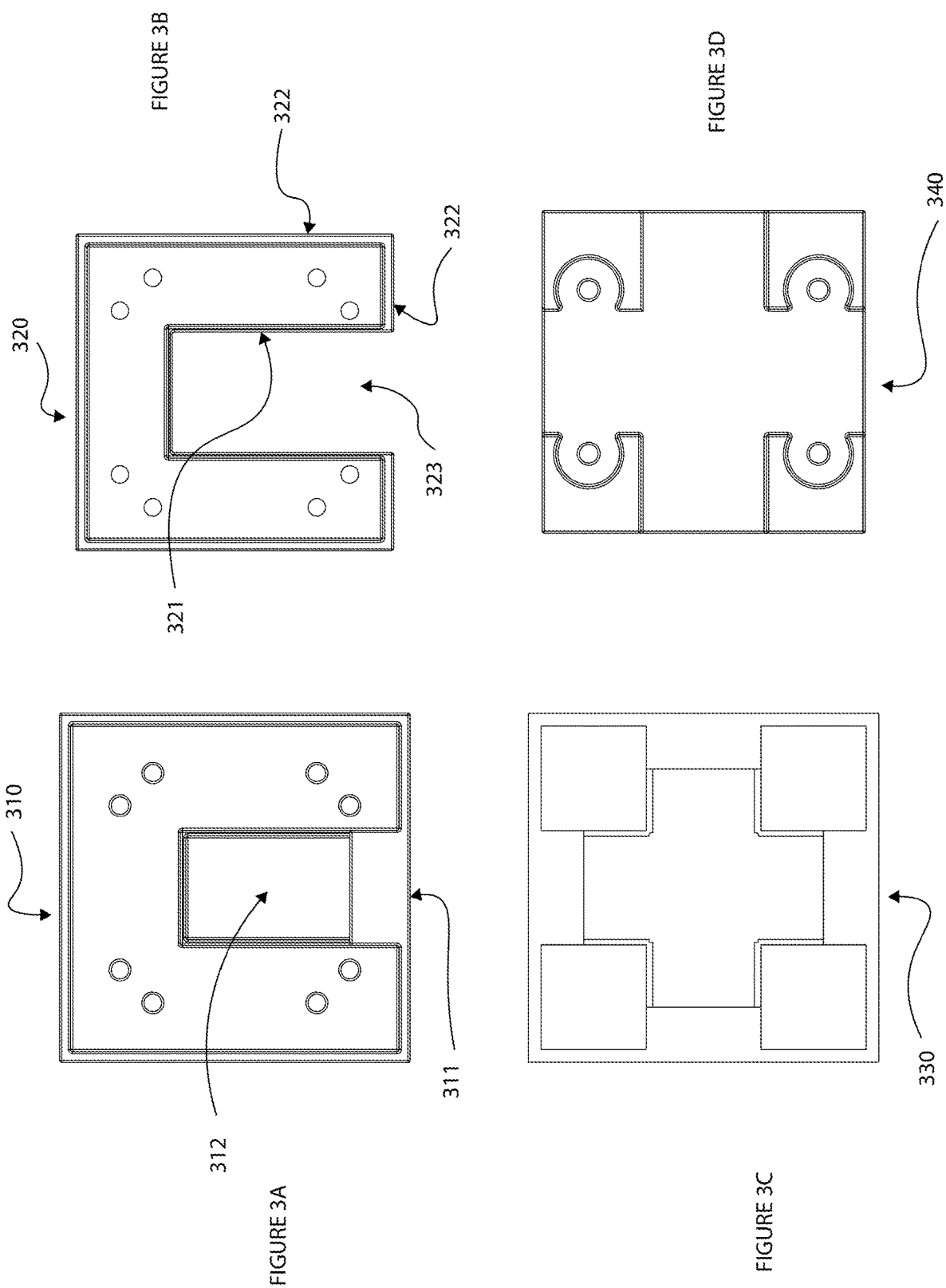

INTEGRATED CIRCUIT TESTING FOR INTEGRATED CIRCUITS WITH ANTENNAS

CROSS REFERENCE AND INCORPORATION BY REFERENCE

Priority is claimed from the following applications which are also hereby incorporated by reference in their entirely: U.S. Provisional Application No. 62/846,842 filed on 13 May 2019 of same title, and U.S. provisional application Ser. No. 62/988,028 filed on 11 Mar. 2020 of same title.

TECHNICAL FIELD

This disclosure relates generally to the field of testing semiconductor device(s) and/or integrated circuit(s). More specifically, the disclosure relates to systems and methods for testing semiconductor device(s) and/or integrated circuit(s) with antenna or with antennas being mounted on the top or on the side(s) of the semiconductor device(s) and/or the integrated circuit(s) in a package.

BACKGROUND

Chips (such as semiconductor devices and/or integrated circuits) which can transmit or receive radio frequency (RF) signals need to be tested like other chips but they present special problems. For example, the placement of the transmit antenna on different chips may not be consistent and thus receiving and testing the signal strength may require expensive and complicated custom set up to transition from testing one chip to testing a different chip. Antennas in Package (AiP) are becoming more prevalent in designs as antennas are being incorporated into packages of the chips to save space and improve performance. Antennas transmit power Over the Air (OTA) so it causes issues trying to test chips with antennas because the antennas are typically on the opposite side of the package from the input/output (I/O, such as pads, leads, or balls) ports of the chip and require interfaces to multiple sides of the package, which present many issues when tested in traditional handlers with traditional testers. For testing chips with antennas, a receiving antenna is needed and a corresponding transmitting antenna is needed to provide antenna signal to the one in the chip package. Some newer ideas to test these antennas in 5G applications are to use horn antennas or probes and route signals through waveguide or coax to sockets that can route signals to testers. Both of these methods are very expensive and use up too much space making it mechanically not feasible.

BRIEF SUMMARY

To avoid the costs of custom set up to test chips (such as semiconductor devices and/or integrated circuits (ICs)) with RF antennas, a testing system can be created which has small flexible receiving antenna(s) that pick up RF output signals from the device under test (DUT) in numerous places inside an enclosure, and has a circuit that converts the RF signals into direct current (DC) voltages where the DC voltage level is proportionate to the RF output signal level. Antennas transmit power Over the Air (OTA). With enough antenna and/or RF detectors in the testing system, the DC voltages can be used to reconstruct antenna patterns from the DC measurements. This test system can be for antennas with beam steering that would yield different results in DC voltages depending on how the beam is steered. A calibrated device with a known antenna pattern and steering capability (a golden unit) could be placed in the test fixture (also referred to as an alignment plate) of the testing system and the measured DC voltage patterns can be recorded for each antenna pattern then used to provide limits/pattern to duplicate devices with similar antennas to determine if the antenna response meets the pattern requirements. The measured DC voltages could be recorded for golden units (which can be defined as units whose performance and/or characteristics of the antenna pattern are known, the golden unit can be calibrated as a transmitter and/or a receiver, and can be used to test a receiver and/or a transmitter) and units at minimum and/or maximum performance levels so the corresponding DC voltage levels or limits can be measured to determine if the tested antenna is working within limits or has failed quickly and much cheaper than using a waveguide horn or other probe systems. Material used for internal structures of an enclosure of the testing system can be designed to be "Radome like" which means the signal from the chip will have minimal transmission loss as it passes through the enclosure at the frequency of operation of antenna in the DUT chip package. Radome can be defined as a dome or other structure protecting radar equipment and made from material transparent to radio waves. With the embodiments disclosed herein, the performance of the antennas of the DUT can be measured accurately.

Also disclosed is a system for testing integrated circuits with RF antennas, having any or all of the following: an alignment plate for receiving a DUT having at least one RF transmitting antenna; an enclosure surrounding but separated from the transmitting antenna; a receiving antenna housed in the enclosure; an RF to DC voltage conversion circuit connected to the receiving antenna for converting the RF output from the DUT to a DC voltage; whereby the DC voltage is used as a proxy for RF output to test the DUT.

Also disclosed is a method of testing integrated circuits with RF antennas having any or all of the following steps: inserting a device under test (DUT) having an RF antenna into an alignment plate; surrounding the RF antenna by an enclosure containing a receiving antenna; converting RF signals received at the receiving antenna into a corresponding DC voltage, the voltage being a representation of the RF signal strength at the receiving antenna.

Also disclosed is a method of tuning the receiving antenna to a predetermined desired frequency by cutting away portions thereof.

Also disclosed is a method of constructing the enclosure of an air transmissible material to allow controlled air flow into the space defined by the enclosure to control the DUT ambient temperature.

Also disclosed is a method of constructing the enclosure of a radio absorptive material to prevent RF signal reflection from the walls of the enclosure and any multi-pathing that could corrupt the antenna measurement.

BRIEF DESCRIPTION OF THE SEVERAL VIEWS OF THE DRAWINGS

References are made to the accompanying drawings that form a part of this disclosure and which illustrate embodiments in which the systems and methods described in this specification can be practiced.

FIG. 2a is a top plan view of enclosure/cover 260.

FIG. 2b is a sectional view of FIG. 2a along lines A-A.

FIGS. 3a, 3b, 3c, and 3d are schematic drawings of enclosures of a testing system, according to an embodiment.

Like reference numbers represent like parts throughout.

DETAILED DESCRIPTION

Figure 1:
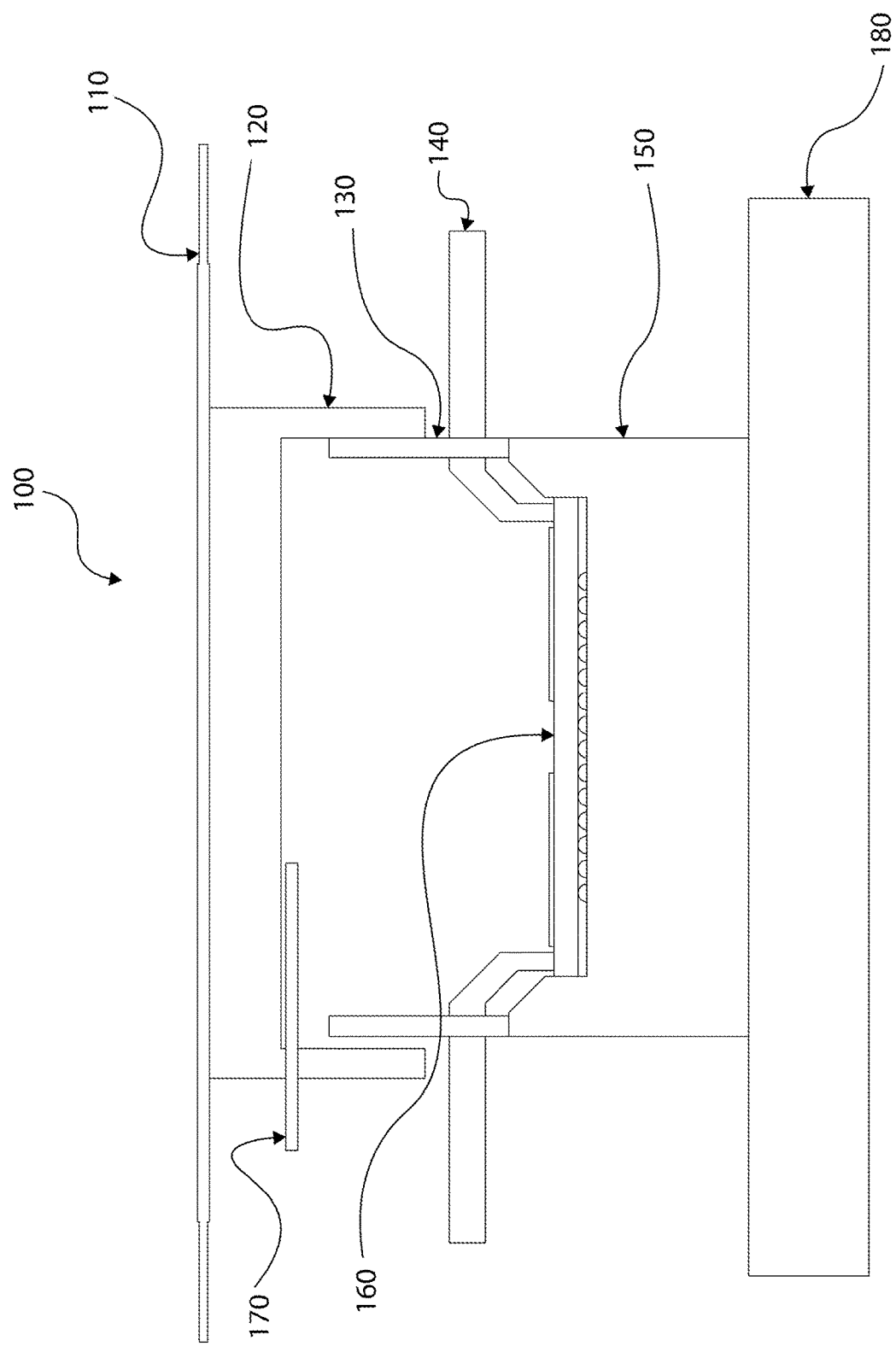
FIG. 1 is a schematic drawing of a testing system using a telescopic enclosure with an antenna inserted into the space defined by the enclosure, according to an embodiment.

Some mission critical AiP (antenna in package) chips (such as semiconductor devices and/or integrated circuits (ICs)) may require extensive testing in a chamber (enclosure) because of regulatory requirements. Typically the AiP chip manufacturers may perform rigorous testing at wafer level and perform minimal testing at final OTA test to determine if antenna installation has caused chip damage. The embodiments disclosed herein can facilitate the final OTA testing in an expedient manner in an RF chamber which can save time and reduce the cost of testing.

Instead of using actual antenna patterns which typically take a long period of time to measure accurately and require large spaces to get measured results in far field of the antenna signals, embodiments disclosed herein are geared towards a final OTA testing where the performance of the RF signals of an antenna is compared to an actual "golden" unit (a unit known to have the exact desired characteristics) or to units that might represent average, best, and worst case performance of devices that will be tested. With these devices tested, a corresponding set of DC characteristics/pattern for each antenna tested under each test scenario can be determined, which can result in DC limits/pattern to define if future tested AiP chips will be good or bad based on their relationship to the DC characteristic from acceptable golden unit testing. Depending on the location of antennas in the enclosure of the testing system, and the fact that the RF signals of the antenna can experience a loss ($1/R^2$, R is the distance between the transmitting antenna and the receiving antenna, the farther away the distance R, more loss of the RF signal will be, the strength of the RF signal outputted at the transmitting antenna is $R^2$ times the strength of the RF signal received at the receiving antenna), the testing system may require some RF amplification between the receiving antenna and the RF detector to get signal inside a predetermined dynamic range of the RF detector. Note: the terms "receiving antenna" are interchangeable with "transmitting antenna" in this document, including the claims, since a DUT may need to be tested in either or both modes.

In an embodiment, material for the internal structures between the transmitting antenna and the receiving antenna (such as the structure(s) to hold down the DUT in place) can be used such that material properties have minimal RF transmission loss at frequency of operation of the antenna(s), i.e., like Radome materials.

The placement of different measuring/receiving antennas in an enclosure including spreading apart the receiving antennas to measure the antenna beam of the DUT, and the height above the antenna of the DUT (the distance between the receiving antenna and the antenna of the DUT) can be set up to generate an RF power level such that the RF signal is well within the predetermined RF detector dynamic range. If the antenna of the DUT is able to steer beams, then different beam positions can yield different power measurements preferably derived from DC voltages from output of the RF detectors. This test method, is extremely fast and easier to implement than other solutions, requires software algorithm to reconstruct antenna RF signal patterns from DC voltages, and requires measuring/receiving antennas to be calibrated so that detected voltages outputted can be translated into accurate RF power levels. Receiving antenna and circuits (such as conversion circuit and/or gain circuit) can preferably be made from thin substrate material that is flexible so they can adhere to any curved surface in the test chamber/enclosure. As the (RF) frequency of devices goes up, wavelength gets shorter and hence antenna pattern size will decrease so more circuits (such as conversion circuit and/or gain circuit) can be placed in the enclosure of the testing system to receive packaged device antenna pattern making it easier to recreate the antenna pattern from DC voltages from RF detectors. A bandpass filter can be added to the receiving antenna circuit design with the passband being the antenna frequency to reduce unwanted RF signals being received by detector, maybe due to multi-paths (caused by RF signals reflecting from walls) noises. To reduce multi-paths noises, radar absorbing materials or paint can be used to help attenuate RF signals not being received by receiving antennas and reduce the likelihood of multi-path signals reflecting off the enclosure surfaces towards receiving antennas.

To hold the DUT package in the alignment plate and not have material interfering with the DUT package antenna pattern, the alignment plate could be four separate parts with rubber band like material around moving pieces to force DUT to be held in place. Other holding options are using cutout in bottom of the frame of the alignment plate and pull DUT down with vacuum. Another option is to have sliding mechanism to clamp to sides of the DUT and hold the DUT in place. See for example the co-owned patent application Ser. No. 63/009,836 filed on Apr. 14, 2020 entitled "OVER THE AIR (OTA) CHIP TESTING SYSTEM" which is incorporated by reference in its entirety. Top portion of the area of the enclosure that houses the receiving antennas could be made from mesh using the principles of a Faraday cage, with openings such that the DUT signal wavelength at test frequency is unable to escape but allow air flow to control the temperature (hot, cold, ambient, etc.) inside the testing system (the measurement apparatus).

The antenna of the DUT can be held down using material (e.g., Radome material) that is invisible to frequency of operation and has minimal attenuation at test frequency. This is the same principal used with the covering over antennas of DUT to protect them from the elements. If the DUT antenna is on the edge(s)/side(s) of the DUT, the alignment plate would have opening(s) on that side and have enough of edges to hold the DUT in place. It is possible to have ball guide features in the alignment plate for final precise alignment. This might require the ball guide to be made from Radome like material (invisible and lossless at the frequency of operation of the DUT antenna).

Because the RF power drops as $1/R^2$ where antenna placements occur will determine the specifications of the customized circuit (e.g., amplifier) to get the power level within the RF detectors' predetermined dynamic range. Calibration of testing system and subsequent testing of golden units can determine acceptable limits/pattern/ranges of the DC voltage from the RF Detectors for each individual test. Beam steering tests will require multiple receiving antennas to be used in the enclosure and the output DC voltages will fluctuate from the RF detectors depending on how beam is steered.

The circuits will change depending on where the customer needs the receiving antennas relative to the DUT antenna in package. The farther away the receiving antennas have to be from the DUT antenna, the more amplification or gain the receiving antenna/amplifiers combination needs to have to assure the signal is within the predetermined dynamic range of the RF detector. Patch antennas, such as antennas which are printed on a flat substrate, are very narrow band devices so it may be possible for some applications to operate without bandpass filtering. Other types of antennas could also be used in measuring system such as dipoles, spiral, etc. The more accurate the antenna RF signal pattern required, the more antenna chains (more elements in the circuit) are needed and the more complex the software will be to reconstruct the RF pattern from DC voltages provided by the RF Detector. If the goal of the testing system is to just monitor the antenna incorporated package power, the switch and transmitter path is not needed in the design. To prevent unwanted multi-paths noises from occurring and disrupting measurements, either eco-absorb material to attenuate RF signals needs to be included in area of the cavity of the enclosure around the receiving antennas, or potentially absorbing paint to attenuate RF signals bouncing off surfaces/walls of the enclosure. The absorbing material should have good attenuating characteristics at frequency of test and/or frequency of the AiP device.

FIG. 1 is a schematic drawing of a testing system 100 using a telescopic enclosure with an antenna inserted into the space defined by the enclosure, according to an embodiment.

The system 100 is for testing chip(s) such as semiconductor device(s) and/or integrated circuit(s) (ICs) having antenna(s). The system 100 includes an enclosure (120, 130). The enclosure (120, 130) includes an upper portion (120, 130) and a lower potion 130. The upper portion 120 and the lower potion 130 defines a cavity of the enclosure (120, 130). The height of the enclosure can be adjusted to adapt to the RF frequency of transmission (e.g., of the DUT antenna). The upper portion 120 and the lower potion 130 can be press fit together. In an embodiment, the upper portion 120 can telescope into the lower portion 130 (or vice versa) to adjust the height of the cavity to adapt to different frequencies or directional fields. The upper portion 120 and the lower potion 130 can also be connected by a connection assembly (not shown) having a connecting mechanism and a locking mechanism (such as bolt(s) and nut(s)) or can have a pneumatic or gear drive to adjust height. The connection assembly can be adjusted (e.g., the length of the bolt or spacer inside the cavity can be adjusted (decreased and/or increased) to adjust the height of the enclosure (120, 130).

The upper portion 120 includes at least an opening so that a circuit board holder 170 can be inserted in to the cavity of the enclosure (120, 130) through the opening. The upper portion 120 can be a square or rectangular or circular shape so long as the two parts are in a slidable mating relationship. Each of the four sides of the upper portion 120 can include an opening, and each of the opening can allow a circuit board holder to be insert into the cavity of the enclosure or the upper part may be robotically removed during insertion and then replaced for test. The robot can also be adjusted to know the precise telescope height needed for a particular test and adjust for subsequent tests at different frequencies. The system 100 also includes an alignment plate 160 to hold a DUT (not shown) in a recess in the middle of the alignment plate 160. In the embodiment illustrated in FIG. 1, the DUT includes antenna(s) on the top surface of the DUT facing the circuit board holder 170. The circuit board holder 170 can hold a flexible circuit such as the circuit of FIG. 5. It will be appreciated that the circuit board holder 170 can hold one or more elements (e.g., a receiving antenna) of the circuit. It will also be appreciated that the term receiving antenna(s) is/are referred to as the antenna(s) of the testing system used to receive RF signals output from the DUT antenna (AiP) to test the performance of the DUT antenna. The receiving antenna(s) can also serve as transmitting antenna(s) that transmit(s) RF signals to the DUT antenna to test the responsiveness/sensitivity of the DUT antenna. The DUT antenna can transmit RF signals to (the receiving antenna of) the tester and can also receive RF signals from (the transmitting antenna of) the tester.

Figure 2:
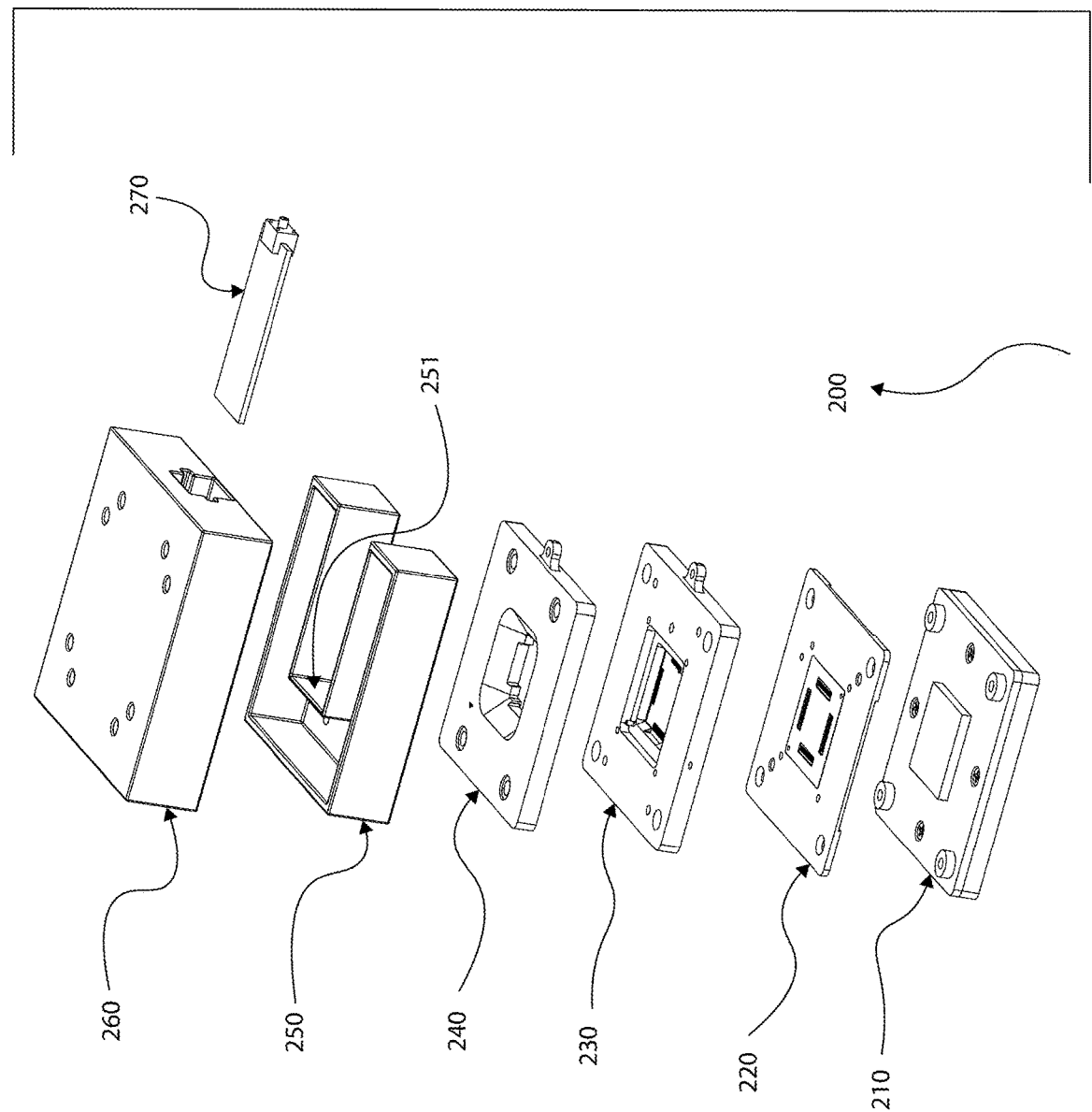
FIG. 2 is an exploded view of a testing assembly for the final OTA testing of AiP chips, according to an embodiment.
Figure 2C:
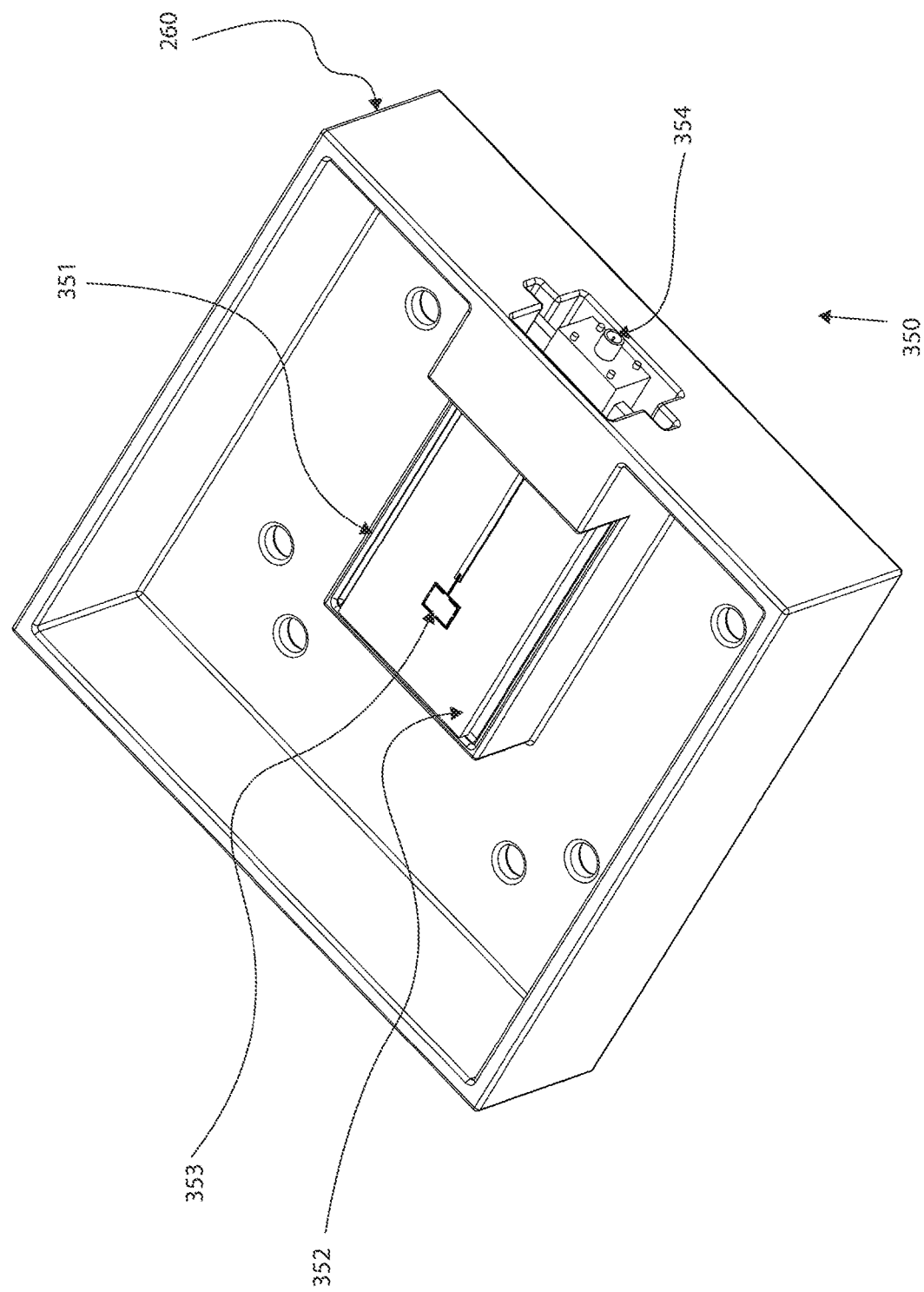
FIG. 2c is a bottom perspective view of enclosure/cover 260
Figure 4:
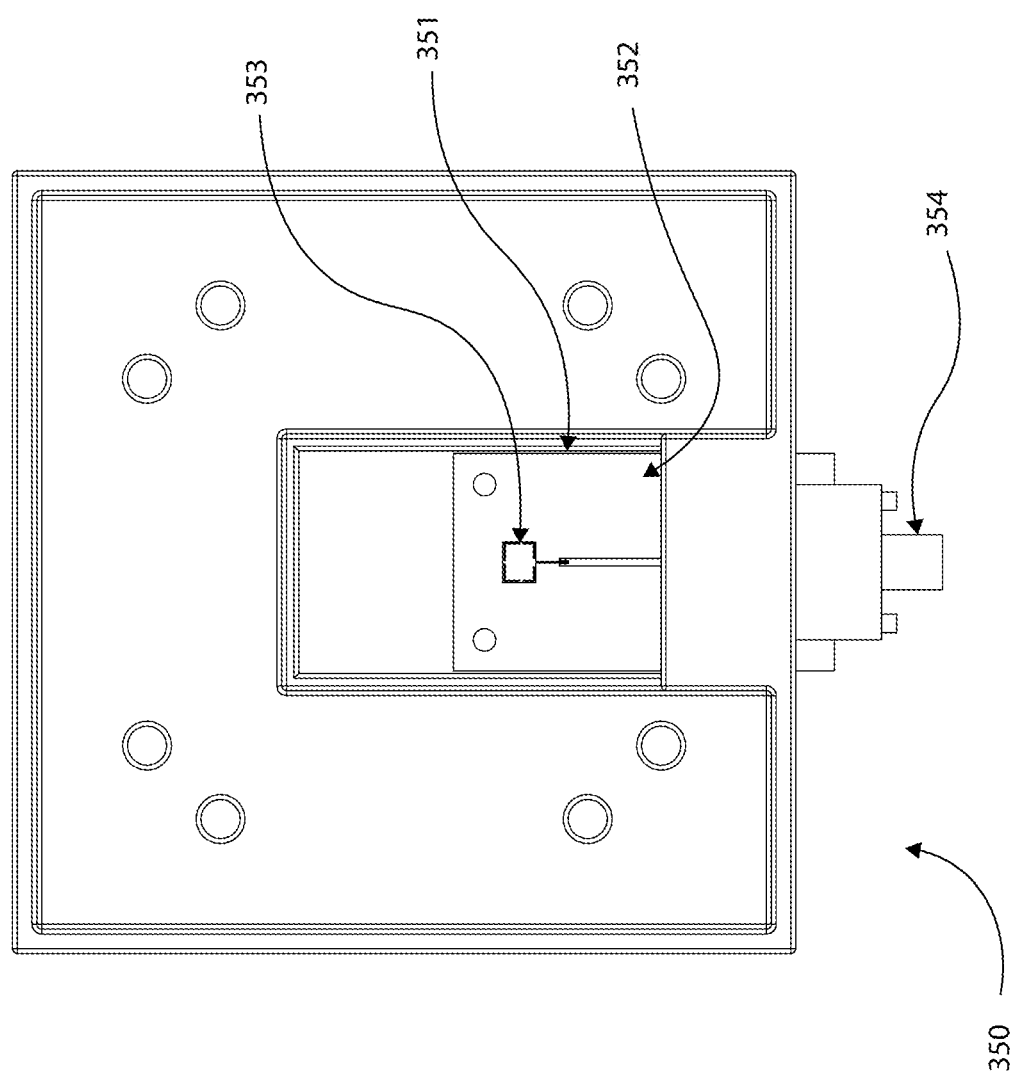
FIG. 4 is a bottom plan view of FIG. 2c.

The system 100 further includes a socket 150, an optional clamping plate 140 mounted to the socket 150, a load board 180, and a rigid board 110 mounted to the load board (see FIG. 2 for detailed description on the socket, the clamping plate, the load board, and the tester). The rigid board 110 can help to hold the enclosure (120, 130) and other components between the rigid board 110 and the load board 180 in place.

FIG. 2 is an exploded view of the building blocks of a testing assembly 200 of a testing system for the final OTA testing of AiP chips (DUT, not shown), according to an embodiment. It will be appreciated that the connection assembly such as fasteners and/or parts that mount and manipulate the various building blocks of the testing assembly are not shown.

The testing assembly 200 includes a stiffener 210, a load board (not shown), a socket 220, an alignment plate 230, an optional clamping plate 240, an enclosure (250 and 260), and a circuit board holder 270.

The stiffener 210 can provide structural support to the load board (daughter board, not shown, see FIG. 1) to minimize deflection to ensure socket 220 contacting with the load board.

The load board is used to route signals from the DUT (via the socket 220) to a tester (not shown) or vice versa. The tester is used to test the DUT (e.g., by sending commands/inputs to the DUT and/or by receiving data/outputs from the DUT). The load board is mounted to a test head in the tester. In the testing assembly 200, the load board is disposed between the stiffener 210 and the socket 220.

The socket 220 is used to provide a pathway for inputs/outputs of the DUT to the tester (via the load board).

The device alignment plate 230 is to align the DUT (e.g., chip, not shown) to the socket 220. The alignment plate 230 is aligned and is attached to the stiffener 210 by e.g., fasteners that go through holes of the socket 220 and the load board. The alignment plate 230 has a recess/opening (e.g., in the middle of the alignment plate 230) with alignment features and a holder (e.g., z direction up-stop) to hold the DUT and align the DUT to the socket 220 (so that the input and/or output pins/pads/lines of the DUT are aligned with the 10 pins/pads/lines of the socket 220).

The clamping plate 240 is optional. The clamping plate 240 can hold the DUT firmly against the load board (via the alignment plate 230 and the socket 220) during testing. In one embodiment, vacuum (instead of the clamping plate 240) can be used as a hold down mechanism for the DUT. In another embodiment, the alignment of the DUT (by the alignment plate 230) can be made as flush as possible, and the DUT can be held at the corners rather than using a clamping plate.

The enclosure (250 and 260) has an upper portion 260 and a lower portion 250. The enclosure (250 and 260) walls can have radio-absorbents (e.g., paint material) to absorb RF signals so that (reflected noises/signals can be reduced. The lower portion 250 has a cavity formed by optional internal structures 251 or by the walls of the lower portion 250. The walls of the lower portion 250 and the walls of the upper portion 260 can be made from RF signal isolation material (e.g., RF absorbing material, filled with RF absorbing foam). In one embodiment, the internal structures 251 can be optional. In another embodiment, the internal structures 251 can be made of e.g., Radome material that is transmissive (e.g., material that is transparent to RF radio wave) of certain frequencies the antenna of the DUT is operating at. In one embodiment, the internal structures 251 include a three sided frame of walls which provide support for portion 250. Not shown are slots which are provided to receive a patch antenna and circuit board 270 bounded by the three sided frame of walls.

In such embodiment, the internal structures/walls 251 is removable from the lower portion 250 so that they can be replaced with different material each time when the frequency of antenna of the DUT is changed.

Either the upper portion 260 or the lower portion 250 can be fixed to the clamping plate 240 (or to the alignment plate 230 if the clamping plate 240 is optional). The non-fixed portion of the enclosure (250 and 260) is height adjustable so that the height of the cavity space of the enclosure can be adjusted to accommodate testing different frequencies of the antenna of the DUT. In one embodiment, the upper portion 260 can telescope into the lower portion 250 (or vice versa) to adjust the height of the cavity space of the enclosure. In another embodiment, a spacer can be used between the upper portion 260 and the lower portion 250 to adjust the height of the cavity space of the enclosure. When the height of the cavity space of the enclosure is adjusted, a lock mechanism (not shown, such as nut(s)) can be used to lock the upper portion 260 and/or the lower portion 250 in place so that the upper portion 260 and/or the lower portion 250 is fixed during the testing. As explained in prior embodiments, pneumatic or mechanical systems may be used to adjust the height.

The upper portion 260 has an opening for mounting an OTA RF signal circuit board holder 270. The circuit board holder 270 can include a wave-guide or a sensor to convert the incoming signal received to waves, such as electromagnetic waves, radio waves, etc. The circuit board holder 270 is connected to the tester. In one embodiment, the circuit board holder 270 includes a circuit having an antenna (see FIG. 5). The antenna of the circuit on the circuit board holder 270 can be a patch/pad antenna (typically is a narrowband antenna). In one embodiment, the antenna of the circuit on the circuit board holder 270 can be dipole and/or monopole antenna (for e.g., broadband). In one embodiment, the upper portion 260 has up to four (4) openings (on each side surface of the upper portion) for housing four (4) circuit board holders 270 (see FIGS. 3a-d and 4).

In one embodiment, there can be 1, 2, 3, or 4 (or more) patch antennas so that they can steer and determine the direction where the antenna of the DUT is pointing to (e.g., by picking up different RF power levels on the signals from the antenna of the DUT) by using e.g., a predetermined antenna signal pattern of the DUT. See FIG. 6a-c. It will be appreciated that if the antenna of the DUT is moving, re-calibration process may be needed (e.g., if one patch antenna is used for testing). Using more than one patch antenna can help to reduce/remove the need of re-calibration. As such, instead of transferring RF power (subject to loss in terms of $1/R^2$) to the tester, voltages (corresponding to certain RF power levels) can be transferred. It is therefore desirable to locate the RF to voltage circuit close to the antenna. In another embodiment, each of the 4 patch antennas can be tuned to handle different frequencies, and thus up several antennas of the DUT can be tested simultaneously (see FIG. 6c).

Since the height of the cavity of the enclosure (250, 260) can be adjusted (noting the signal loss in terms of $1/R^2$), depending on the frequency of the antenna of the DUT, the antenna on the circuit board holder 270 can be configured to be always in far-field (a distance sufficient so that the signal pattern can be formed as a recognizable pattern, and where the RF signal power can be readily detected and determined to correspond to the antenna frequency) of the DUT antenna signal pattern. In one embodiment, 5 GHz far field correspond to at or about 17-20 mm distance (between the antenna of the DUT and the antenna of the circuit on the circuit board holder 270, i.e., the height of the cavity of the enclosure); 81 GHz (for antenna used in a car) far field corresponds to at or about 1 mm distance; 5 GHz bands correspond to at or about 10 mm distance. The lower the frequency (the wavelength is larger) is, the farther away the distances. Embodiments disclosed herein can be used for testing different frequencies of different antennas (e.g., at or about 5-40 GHz).

FIGS. 3a-d and 4 show various embodiments of the enclosure (250, 260) of the testing assembly 200 of FIG. 2. Some of the embodiments in FIGS. 3a-d and 4 also shows the circuit board holder 270 of FIG. 2 (some embodiments can hold up to 4 circuit board holders).

Referring back to FIG. 2, in one embodiment, the DUT, the clamping plate 240, and the enclosure (250 and 260) can be attached to a pick-up arm of a handler or other robotic mechanism (can be x2, x4, x8 etc., depending on tester resource, the structure of the handler and/or mechanism complexity). The pick-up arm of the handler can pick up the DUT (e.g., chip) from an input tray/cassette, insert the DUT into the alignment plate 230, hold the DUT down with the clamping plate 240 against the alignment plate 230 (or the socket 220), wait for the testing to be completed, release the DUT from holding, pick up the DUT, and return the DUT to an output tray/cassette.

The pick-up arm of the handler can adjust the height of the cavity of the space (e.g., by adjusting telescoping of the upper portion 260 or the lower portion 250) to determine a desirable "sweet spot" for far and/or near field testing. The adjustment can be made manually or automated using antenna pattern recognition algorithm and a closed loop feedback control scheme.

It will be appreciated that the near field and far field are regions of the electromagnetic (EM) field around a transmitting antenna. Typically, the purpose of antennas is to communicate wirelessly for long distances using far fields (main region of operation). Typically, the far field carries a relatively uniform wave pattern. The near field typically refers to regions where the propagation of electromagnetic waves is interfered with. As such, far field (relatively uniform wave pattern, less interference and/or noise)

antenna signal pattern is preferred to be used in determining the antenna signal pattern, and that the RF power of the far field (corresponding to an antenna with particular frequency) can be determined and represented by voltage levels.

In some embodiments, the antenna of the DUT is on the top side of the DUT (while the pins/pads/terminals/lines of the DUT are at the bottom side of the DUT opposite to the top side). See FIGS. 1 and 6*a-c*. It will be appreciated that if there is a component between the antenna of the DUT and antenna on the circuit board holder 270, the antenna signal can be attenuated. As shown in FIGS. 1 and 6*a-c*, when the antenna of the DUT is on the top side of the DUT, there is a cavity of the enclosure (250, 260) and no other component is in-between the antenna of the DUT and antenna(s) on the circuit board holder(s) 270.

Figure 7:
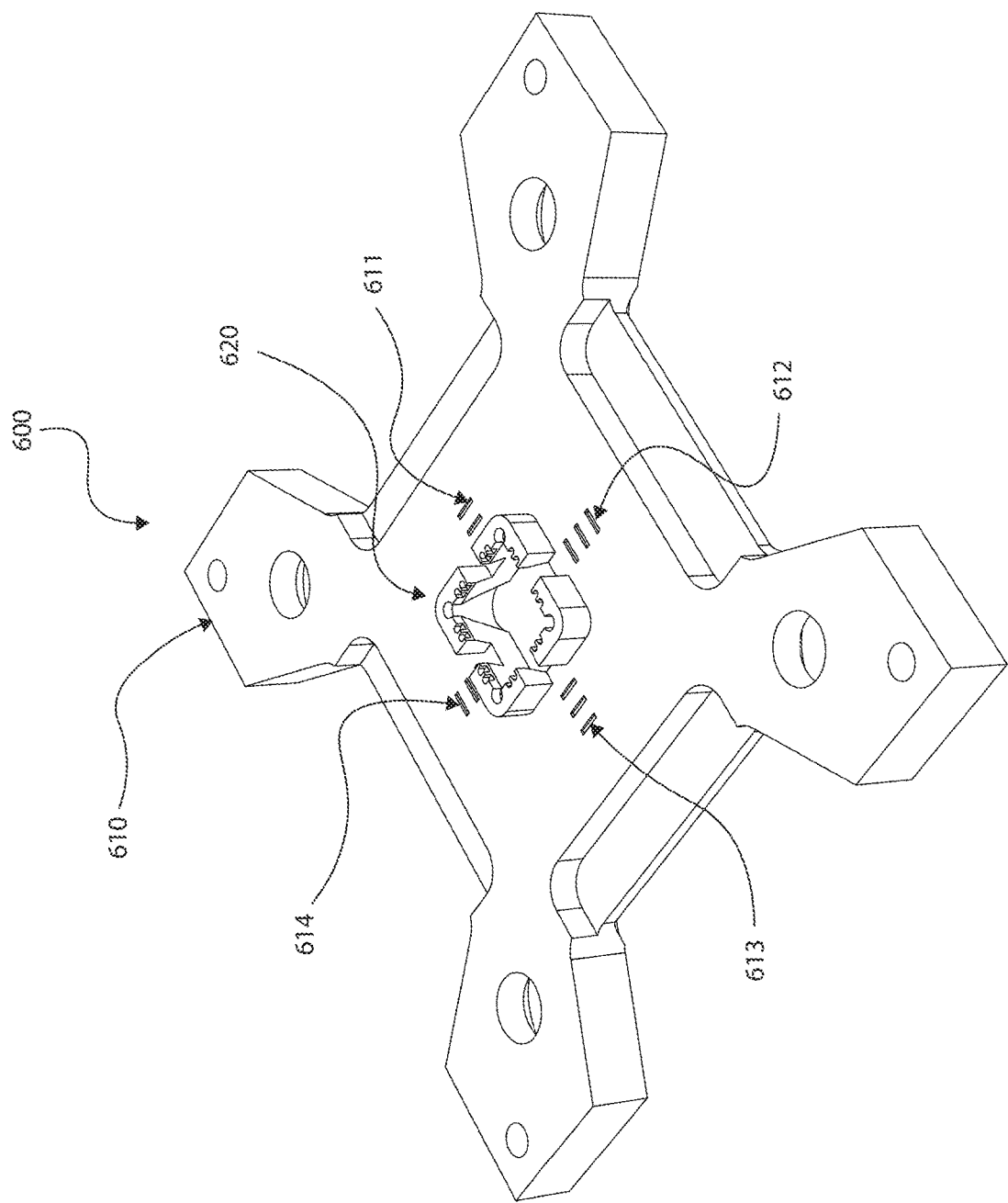
FIG. 7 is a schematic drawing of an alignment plate of a testing system, according to an embodiment.

In one embodiment, the antenna of the DUT can be on the side surface(s) (typically in the middle of the side surface(s)) instead of on the top surface of the DUT. In such embodiment, the alignment plate 230 (typically would wear over time) can align the DUT at the corner(s) of the DUT. See FIG. 7 showing another alignment plate of FIG. 2. The circuit board holder(s) 270 can be disposed in the slots/gaps between the wall of the testing assembly and the antenna of the DUT. There are cut(s)/opening(s) on the alignment plate so that there is no other component blocking the radio path between the antenna of the DUT and the antenna on the circuit board holder(s) 270. As discussed above, the distances between the antenna of the DUT and the antenna on the circuit board holder(s) 270 can be determined by the frequencies of the antenna of the DUT under testing.

FIGS. 3*a-d* and 4 are schematic drawings (310, 320, 330, 340, and 350) of enclosures of a testing system, according to an embodiment.

The enclosure (310, 320) includes an upper portion 310 and a lower portion 320. The upper portion 310 includes an opening 311 to allow a circuit board holder to insert into the cavity of the enclosure (310, 320). The upper portion 310 also includes a supporter 312 to support (hold in place) a portion of the circuit board holder inside the cavity. The lower portion 320 includes inner structure 321, outer walls 322, and a recess 323.

The enclosure (330, 340) includes an upper portion 330 and a lower portion 340. The structures of the enclosure (330, 340) are the same as (or similar to) the structures of the enclosure (310, 320), except that each side of the upper portion 330 has an opening (that allows a circuit board holder to insert into the cavity of the enclosure) and a supporter (that supports the corresponding circuit board holder), and each side of the lower portion 340 has a recess.

The 350 is an upper portion of an enclosure with a circuit board holder 351 inserted into the cavity of the enclosure through the opening of the enclosure. A circuit 352 is disposed on the circuit board holder 351. The circuit 352 can be a flexible circuit, including a pad/patch antenna 353 electrically connected to a connector 354.

Figure 5:
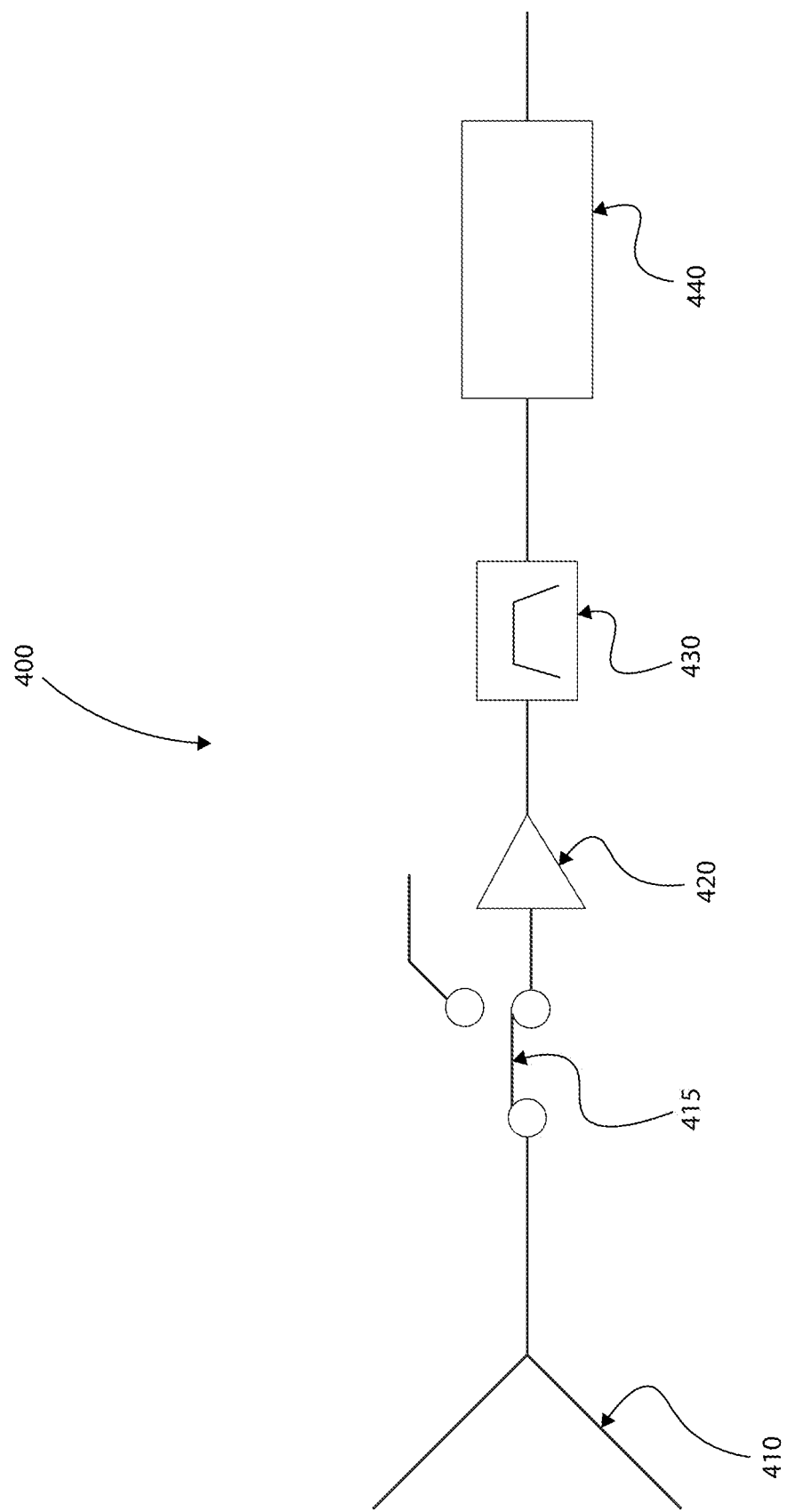
FIG. 5 is a schematic drawing of a circuit, according to an embodiment.

FIG. 5 is a schematic drawing of a circuit 400, according to an embodiment. The circuit 400 can be an RF measurement and/or conversion circuit including an antenna, an amplifier, and RF detector/converter which changes the RF signal into a corresponding (DC) voltage or current. Depending on the measurements needed, an optional variable attenuator could also be incorporated into the circuit 400. Also depending on antenna gain and parallel needed into RF detection, one or more low noise amplifiers (LNAs) or no LNA could be incorporated into the circuit 400 depending on distance between the receiving antenna and the DUT antenna. A switch can also be included to change the tester from a receiving mode to a transmitting mode or to be a detector for different receiving antennas.

The circuit 400 can be disposed on the circuit board holder 270 of FIG. 2. The circuit 400 includes an antenna 410, a low-noise amplifier (LNA) 420 electrically connected to the antenna 410, and a RF detector 440 electrically connected to the LNA 420. In one embodiment, between the antenna 410 and the LNA 420, there can be a switch 415 that selectively connects the antenna 410 to the LNA 420 electrically, or connects the antenna 410 to an RF signal transmitter (of a tester) electrically. In one embodiment, between the LNA 420 and the RF detector 440, there can be an optional filter 430 electrically connects to the LNA 420 and to RF detector 440. A connector (not shown) can connect the output of the RF detector 440 to the tester.

The antenna 410 can be the (receiving and/or transmitting) antenna or a golden antenna unit that is used to test the DUT antenna. As a receiving antenna, the antenna 410 can receive the RF signals output from the antenna of the DUT, and transmit the received RF output signals to the LNA 420. When the RF signals radiating from the antenna of the DUT, the RF signals can bounce off the enclosure walls and generate (multi-paths) noises. Noises typically include those signals not going directly from the antenna of the DUT to the antenna 410.

The LNA 420 can be an electronic amplifier that amplifies a very low-power signal (e.g., RF signals from the antenna) without significantly degrading its signal-to-noise ratio (SNR). A typical amplifier can increase the power of both the signal and the noise present at its input, but the amplifier can also introduce some additional noise. LNAs can minimize that additional noise. In addition, losses of the RF signals received by the antenna 410 can lower the received SNR: e.g., a loss of 3 dB can degrade the SNR by 3 dB. The LNA can supply enough gain (to boost the signal) to offset the loss and to reduce unwanted noise. By using the LNA close to the signal source (e.g., antenna 410), the effect of noise from subsequent stages of the receive chain in the circuit can be reduced by the signal gain created by the LNA. The LNA can boost the desired RF signals' power while adding as little noise and distortion as possible, and thus optimum retrieval of the desired signal in the later stages of the system can be achieved.

The LNA 420 can be electrically connected to the optional filter 430. The filter 430 can be e.g., a narrowband filter. Narrowband filters can have a narrow bandpass. A bandpass is how much of the spectrum the filter allows to pass. The filter 430 can be a 27 GHz-29 GHz (e.g., 28 GHz) narrowband filter. The filter 430 can filter noise due to multi-pathing or bouncing off noises (bounced signal can be off-frequency due to delay, or not as powerful to be detected/picked-up).

The filter 430 can electrically connect to the RF detector 440. The RF detector 440 can get real RF signal radiated/received by the antenna 410 since the noise are filtered/reduced via the LNA and the filter. The RF detector can convert the RF signal (RF power) to a corresponding DC voltage.

An optional attenuator (transformer/impedance, not shown) can be used to transform the impedance of the antenna 410 down (e.g., from at or about 200-300 ohms down to at or about 100 ohms in the middle of the circuit 400, and down to at or about 50 ohms at the connector (not shown, see FIGS. 3*a-d* and 4 for an example of a connector).

When the tester (the testing device/equipment used to test the DUT) is used as transmitter (RF signal generator) and the antenna of the DUT is used as the circuit board receiver, a switch 415 can be included to switch the tester as RF signal transmitter or receiver. The circuit 400 can be a flexible circuit (e.g., the circuit has flexible substrate so that the circuit can be bent around any suitable surface).

It will be appreciated that wave-guide (e.g., 40-60 GHz or 60-90 GHz, depending on the wave-guide opening) used to measure the antenna pattern (e.g., the RF signal pattern from the antenna of the DUT) typically is very expensive. The space (cavity of the enclosure) needed for a wave-guide is relative big. Also cabling (which is also expensive) is needed to carry the signal from the wave-guide to the tester with high frequency capability (HF testers are also very expensive). The circuit 400 can save cost by e.g., transforming the RF signal pattern (of the antenna of the DUT) to digital signal and recompiling the RF signal from the digital footprint at the tester, instead of using wave-guide, cabling, and high frequency tester. The up to four (4) patch antennas (the dimension of the patch/trace can determine what frequency it can receive, see FIG. 6a-c for example) can be used to replace the wave-guide antenna. The patch antennas can be used to handle different frequencies (e.g., each patch antenna corresponds to a particular frequency).

At the end (typically a connector is attached/connected) of the circuit 400, the signal (digital voltage representing the RF signal pattern) can be sent across wires (e.g., unlimited length, may need relay/amplifier, no $1/R^2$ loss). It will be appreciated that a software algorithm would be needed to convert the antenna signal output to digital representation and vice versa. It will also be appreciated that the more RF power, the higher the corresponding voltage would be (e.g., 30 dB RF power can correspond to 1 volt, and less than 30 dB RF power would correspond to less than 1 volt). It will also be appreciated that antenna can have a particular RF electromagnetic (EM) radiation beam/signal pattern. If the antenna is excited differently (e.g., at different angle, or using a different antenna), it can have different signal pattern.

Figure 6B:
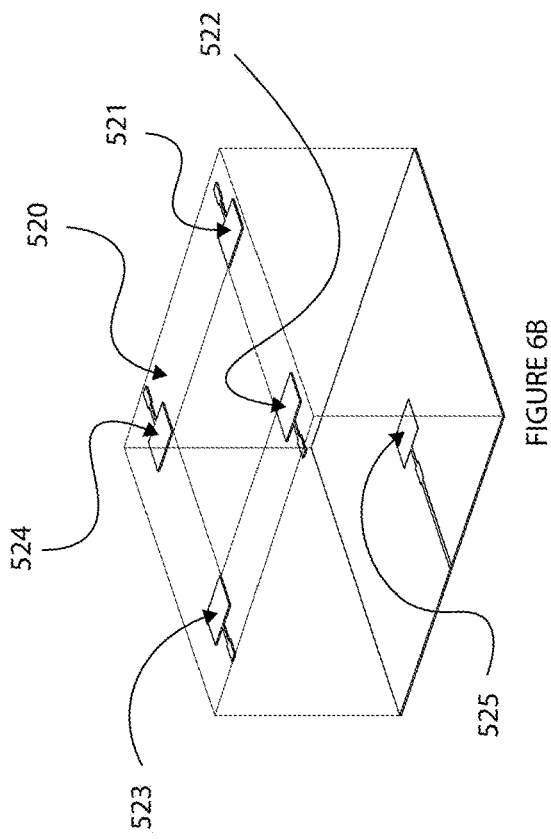
FIGS. 6a, 6b, 6c show schematic drawings of enclosures of a testing system showing receiving and transmitting antennas, according to an embodiment.
Figure 6C:
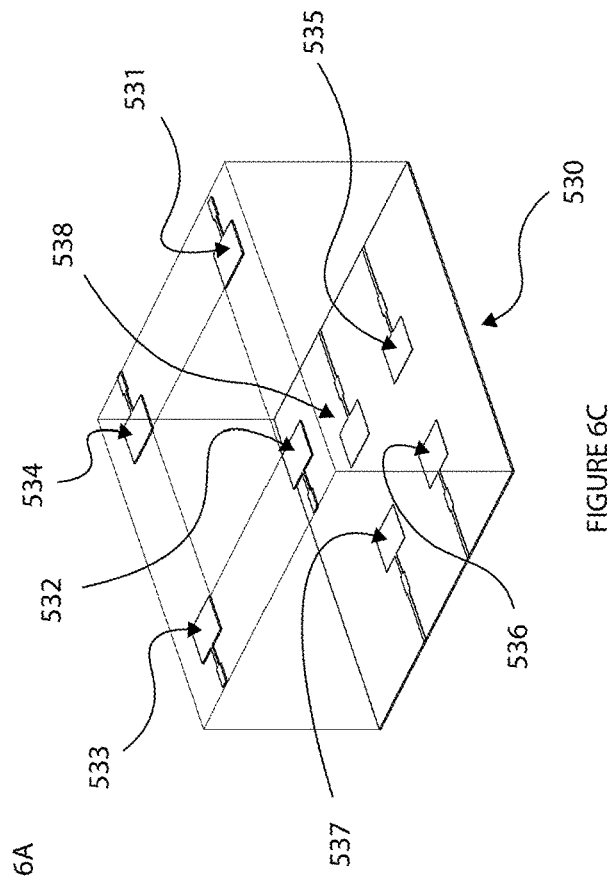
Figure 6A:
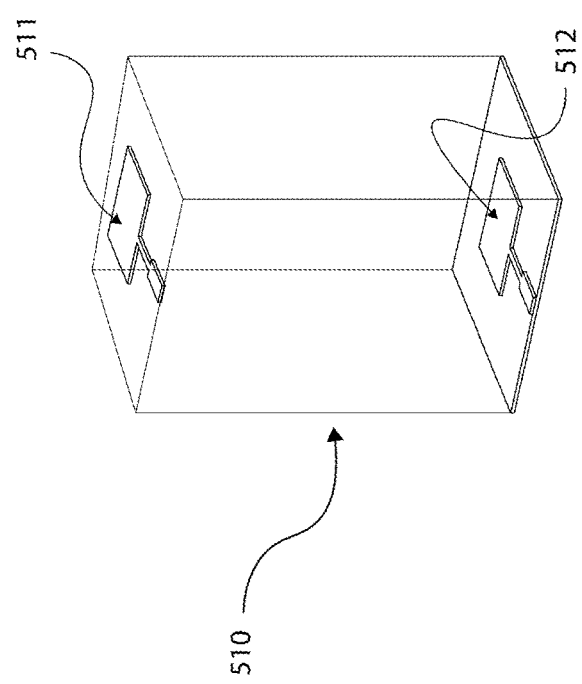

FIG. 6a-c show schematic drawings of enclosures 510, 520, 530 of a testing system showing receiving and transmitting antennas, according to an embodiment.

The enclosure 510 has an antenna 511 on the top and an antenna 512 at the bottom. Either one of 511, 512 can be an antenna (for receiving and/or transmitting) connected to a tester or a DUT antenna. Either one of 511, 512 can be a 28 GHz antenna (sized at 3.422×4.178 mm), a 39 GHz antenna (sized at 2.33358×2.852 mm), or the like. It will be appreciated that tuning the dimension of the antenna to a predetermined desired frequency can be achieved by cutting away portions of the antenna. It will be appreciated that either the antenna can be rotated in place to determine antenna steering, or 2 or 4 or more of the receiving antennas can be incorporated to monitor DUT antenna steering.

The enclosure 520 includes antennas 521, 522, 523, and 524 on the top and in the corners, and an antenna 252 at the bottom. A circuit board holder can be used for each top antenna to insert the circuit having the antenna into the enclosure. An opening can be used with door to insert the DUT into an alignment plate without disturbing the antenna(s). Either the top antennas or the bottom antenna can be the antenna(s) (for receiving and/or transmitting) connected to a tester or the DUT antenna(s). The enclosure 530 includes antennas 531, 532, 533, and 534 on the top and in the corners, and antennas 535, 536, 537, and 538 at the bottom. Either the top antennas or the bottom antennas can be the antennas (for receiving and/or transmitting) connected to a tester or the DUT (having 4 antennas/ports on the surface of the DUT) antennas. The enclosure 530 has an opening (not shown) at the top for insertion of the DUT, or the enclosure 530 can be moved into position after insertion of the DUT into the enclosure.

It will be appreciated that the enclosures 510, 520, 530 can be the enclosures disclosed in FIGS. 3a-d and 4. The antennas in/on the enclosures 510, 520, 530 can be patch/plate antenna(s).

FIG. 7 is a schematic drawing of an alignment plate 600 of a testing system, according to an embodiment.

The alignment plate 600 includes a frame 610 and a holder 620. On the surface of the frame 610, there can be slots 611, 612, 613, 614 for inserting circuit boards such as vertical circuit boards having an antenna and perhaps an RF to voltage circuit as detailed above. The distances between the slots 611 (and 612, 613, 614) and the holder 620 is designed for different RF frequency (due to the $1/R^2$ loss). There is an opening/cut/gap on each side of the holder 620 so that when the antenna ports on the DUT (not shown) are aligned with gaps 620 and when the DUT antennas are located on the side surfaces of the DUT (up to four side surfaces), the DUT antenna can communicate with the antenna on the circuit board holder without obstruction (i.e., no other component is disposed between the opening and the antenna of the circuit on the circuit board holder).

Figure 8:
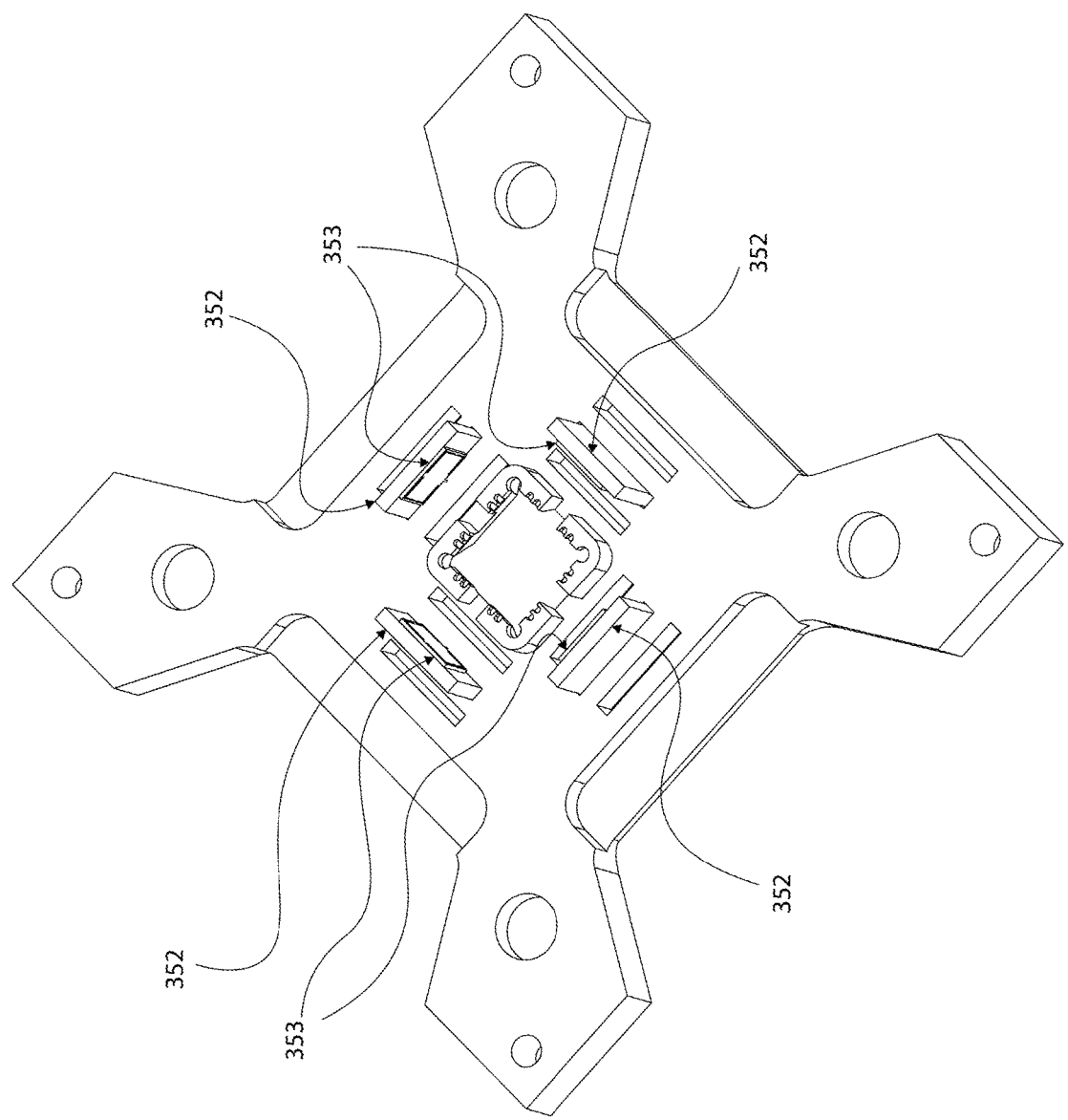
FIG. 8 is a view like FIG. 7 with side mounted receiving antennas.

In FIG. 8, patch antenna 353 can be vertically received within various slots 611-614 so that antenna 353 is directly facing the DUT antenna. FIGS. 7 and 8 show that multiple spaced apart linearly aligned slots are possible so that the distance between the two antennas can be adjusted according to the desired frequency. The slots may also be laterally offset so that limited antenna aiming is possible.

The patch antennas can be tuned to different frequencies by cutting traces which are applied to a substrate. For example, the substrate may have alternative traces which are electrically connected to the tester. For example, the substrate may have a pair of opposing traces which are designed for one frequency and in other places on the substrate, another antenna of a different frequency. Connection to one antenna can be obtained by electrical/mechanical switching from on conductor to another or by cutting away (disconnecting) portions of the trace to achieve different resonate frequencies without physically swapping out the antenna.

Figure 9:
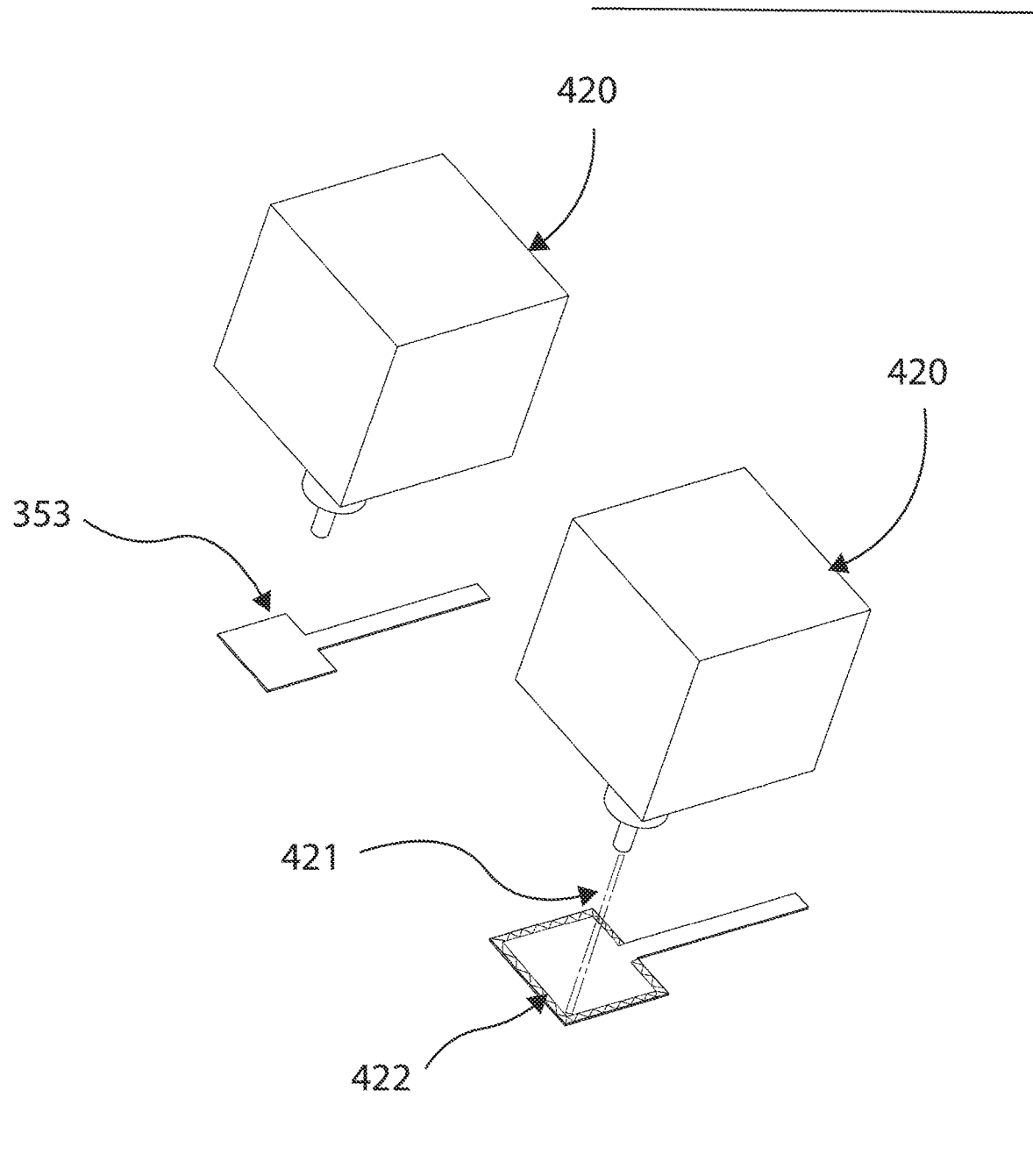
FIG. 9 is a schematic view of two laser cutting antenna tuners.
Figure 10:
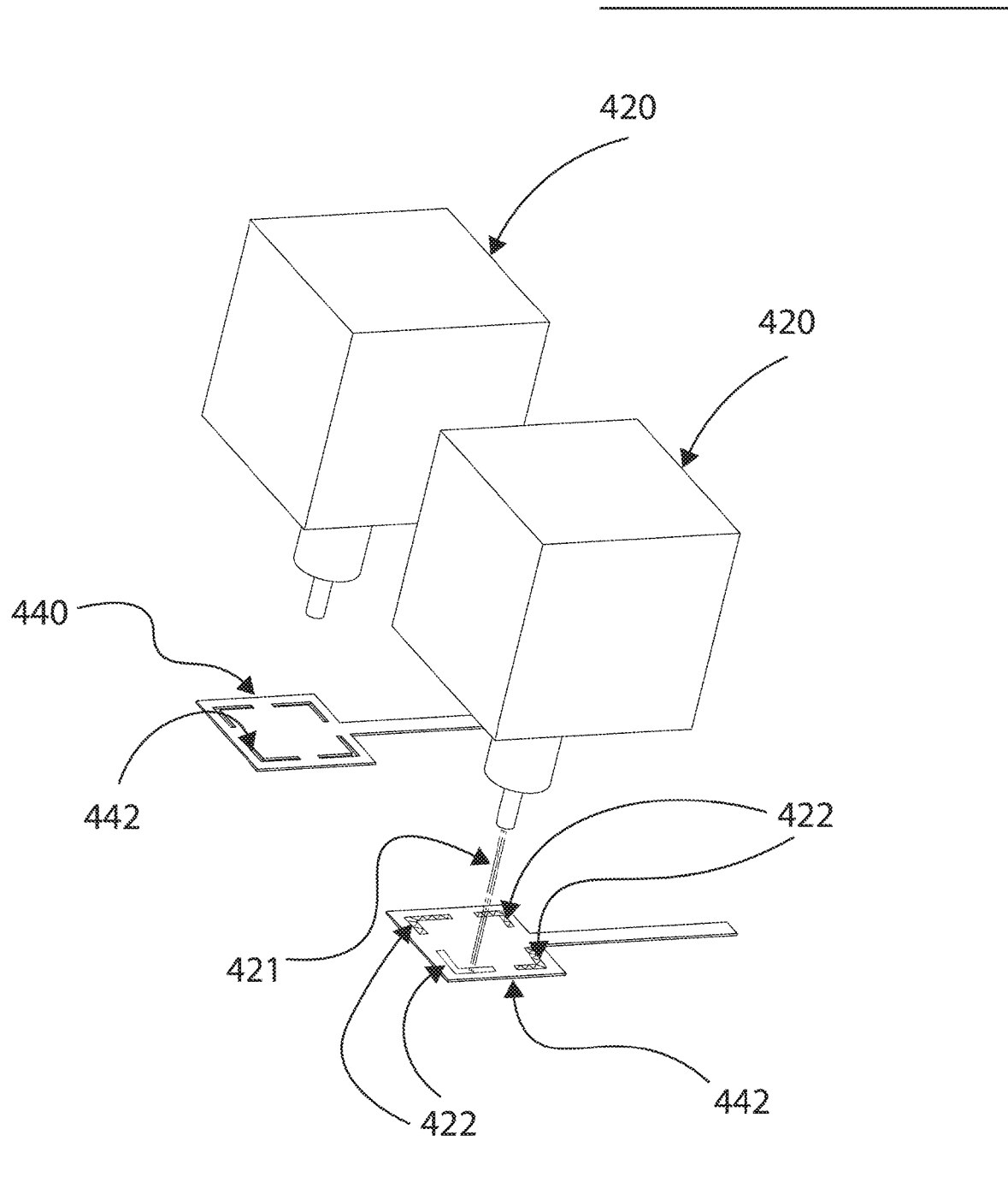
FIG. 10 is a view like FIG. 9 with an alternate laser antenna tuner.

FIGS. 9 and 10 schematically illustrate a structure and method of tuning a patch antenna by cutting the traces 422. Thought mechanical means may also be used, the preferred method is using a cutting laser 420 projecting a laser beam 421 on the patch antenna's conductive trace. In one embodiment the thickness of the trace can be diminished by cutting away a portion of the trace width. In another embodiment traces 422 can be cut away or disconnected from the antenna lead (not shown) to effectively shorten the antenna and thereby raise its frequency.

Alternatively, different frequencies can be tested by sliding out the antenna unit (patch antenna on substrate) in the receiving slots in the antenna housing.

The description of the invention and its applications as set forth herein is illustrative and is not intended to limit the scope of the invention. Variations and modifications of the embodiments disclosed herein are possible and practical alternatives to and equivalents of the various elements of the embodiments would be understood to those of ordinary skill in the art upon study of this patent document. These and other variations and modifications of the embodiments disclosed herein may be made without departing from the scope and spirit of the invention.

Aspects

It is noted that any one of aspects below can be combined with each other.

Aspect 1. A testing system for testing integrated circuits with radio frequency (RF) antennas, comprising:
an alignment plate for receiving a device under test (DUT) having at least one RF transmitting antenna;
an enclosure surrounding but separated from the transmitting antenna;
a receiving antenna in the enclosure;
a conversion circuit connected to the receiving antenna, wherein the conversion circuit is configured to convert an RF output from the DUT to a direct current (DC) voltage, whereby the DC voltage is used as a proxy for the RF output to test the DUT.

Aspect 2. The system according to aspect 1, wherein the enclosure having an upper portion, a lower portion, and a spacer connecting the upper portion and the lower portion;
the receiving antenna is disposed at the upper portion of the enclosure;
the upper portion and the lower portion forming a cavity between the receiving antenna and the DUT;
the spacer is configured to adjust a height of the cavity for different RF frequencies.

Aspect 3. The system according to aspect 1 or aspect 2, wherein the transmitting antenna is on a top surface of the DUT facing the receiving antenna.

Aspect 4. The system according to aspect 1, wherein the transmitting antenna is on a side surface of the DUT facing the receiving antenna.

Aspect 5. The system according to any one of aspects 1-3, wherein the enclosure has four side surfaces, each side surface of the enclosure has an opening, each opening houses a receiving antenna.

Aspect 6. The system according to any one of aspects 1-5, wherein the conversion circuit includes a switch, the switch is configured to electrically connect the receiving antenna to a tester, the tester is configured to test the RF output of the DUT.

Aspect 7. The system according to any one of aspects 1-6, wherein the conversion circuit includes a low-noise amplifier and an RF detector,
the low-noise amplifier is configured to electrically connect to the receiving antenna,
the low-noise amplifier is further configured to amplify the RF output from the DUT received by the receiving antenna;
the RF detector is configured to electrically connect to the low-noise amplifier,
the RF detector is further configured to convert the amplified RF output to a DC voltage.

Aspect 8. The system according to aspect 7, wherein the conversion circuit further includes a filter,
the filter is configured to electrically connect to the low-noise amplifier and the RF detector,
the filter is disposed between the low-noise amplifier and the RF detector in the conversion circuit,
the filter is configured to filter noise in the amplified RF output.

Aspect 9. A method of testing integrated circuits with radio frequency (RF) antennas, the method comprising:
inserting a device under test (DUT) having at least one RF transmitting antenna into an alignment plate;
surrounding the transmitting antenna by an enclosure housing a receiving antenna;
receiving an RF output from the DUT by the receiving antenna; and
converting, by a conversion circuit, the RF output received by the receiving antenna into a direct current (DC) voltage, the voltage being used as a proxy for the RF output to test the DUT.

Aspect 10. The method according to aspect 9, further comprising:
tuning the receiving antenna to a predetermined desired frequency by cutting away portions of the receiving antenna.

Aspect 11. The method according to aspect 9 or aspect 10, further comprising:
constructing the enclosure of an air transmissible material to allow controlled air flowing into a space defined by the enclosure to control a DUT temperature.

Aspect 12. The method according to any one of aspects 9-11, further comprising:
constructing the enclosure of a non-radio reflective material to prevent RF reflection on walls of the enclosure.

Aspect 13. A testing system for testing integrated circuit devices with at least one radio frequency (RF) antenna, comprising:
an alignment plate for receiving a device under test (DUT) having at least one RF transmitting antenna;
a receiving antenna;
an enclosure surrounding but separated from the transmitting antenna, the enclosure including:
a. a first static part;
b. a second movable part, said second part including a receptacle for the receiving antenna;
c. said second part being telescopically movable along an axis generally orthogonal to said DUT, so that the distance between the DUT and the second part can be increased or decreased; and
the receiving antenna being in the enclosure,
whereby the distance between the DUT and receiving antenna is adjustable.

Aspect 14. The system of aspect 13, further including a conversion circuit connected to the receiving antenna,
wherein the conversion circuit is configured to convert an RF output from the DUT to a direct current (DC) voltage, whereby the DC voltage is used as a proxy for the RF output to test the DUT.

Aspect 15. The system according to aspect 13, wherein the second part of said enclosure surrounds, at least in part, said first part of said enclosure.

Aspect 16. The system according to aspect 13, wherein said receptacle includes a pair of spaced apart slots in said second part of said enclosure, and wherein said receiving antenna includes a substrate of width sized to be receivable in said slots.

Aspect 17. The system according to aspect 13, wherein said receiving antenna includes an electrically conductive trace on a substrate.

Aspect 18. The system according to aspect 17, wherein said trace include severable portions which can be electrically disconnected from other portions of the trace to change the frequency response of the antenna.

Aspect 19. The system according to aspect 13, wherein the enclosure has four side surfaces, each side surface of the enclosure has an opening, each opening houses a receiving antenna.

Aspect 20. A testing system for testing integrated circuit devices having top, bottom and edge surfaces with corners at the intersection of said edges surfaces, with at least one radio frequency (RF) antenna mounted on an edge surface, comprising:

an alignment plate for receiving a device under test (DUT) having at least one RF transmitting antenna mounted on an edge surface;
a receiving antenna;
a DUT retainer device, said device including:
a plurality of corner retainers for engaging at least two corners of the DUT; said corner retainers defining a gap, said gap being aligned with said transmitting antenna;
a generally planar portion adjacent said gap, said planar portion including at least one slot for receiving said receiving antenna.

Aspect 21. The system according to aspect 20, wherein said at least one slot includes a plurality of spaced apart slots of different distances from said transmitting antenna on the DUT, and wherein said receiving antenna is sized to fit into any of the slots.

Aspect 22. The system according to aspect 20, wherein the slots are collinearly aligned.

Aspect 23. The system according to aspect 20, further including a conversion circuit connected to the receiving antenna,
wherein the conversion circuit is configured to convert an RF output from the DUT to a direct current (DC) voltage, whereby the DC voltage is used as a proxy for the RF output to test the DUT, and
wherein the conversion circuit includes a low-noise amplifier and an RF detector.

Aspect 24. The system according to aspect 23, wherein the low-noise amplifier is configured to electrically connect to the receiving antenna,
the low-noise amplifier is further configured to amplify the RF output from the DUT received by the receiving antenna;
the RF detector is configured to electrically connect to the low-noise amplifier,
the RF detector is further configured to convert the amplified RF output to a DC voltage.

Aspect 25. The system according to aspect 23, wherein the conversion circuit further includes a filter,
the filter is configured to electrically connect to the low-noise amplifier and the RF detector,
the filter is disposed between the low-noise amplifier and the RF detector in the conversion circuit,
the filter is configured to filter noise in the amplified RF output.

Aspect 26. A method of testing integrated circuits with radio frequency (RF) antennas, the method comprising:
inserting a device under test (DUT) having at least one RF transmitting antenna into an alignment plate;
surrounding the transmitting antenna by an enclosure having a top wall spaced from the DUT,
locating a plurality of spaced apart receiving antennas on said top wall facing said transmitting antenna;
providing an adjuster capable of changing the distance between said top wall and said DUT to adapt for tests at different frequencies.

Aspect 27. The method according to aspect 26, further comprising:
tuning the receiving antennas to a predetermined desired frequency by cutting away portions of the receiving antenna.

Aspect 28. The method according to aspect 26, further comprising:
constructing the enclosure of an air transmissible material to allow controlled air flowing into a space defined by the enclosure to control a DUT temperature.

Aspect 29. The method according to aspect 26, further comprising:
constructing the enclosure of an air transmissible material to allow controlled air flowing into a space defined by the enclosure to control a DUT temperature.

Aspect 30. The method according to aspect 26, further comprising:
constructing the enclosure of a non-radio reflective material to prevent RF reflection on walls of the enclosure.

The terminology used in this specification is intended to describe particular embodiments and is not intended to be limiting. The terms "a," "an," and "the" include the plural forms as well, unless clearly indicated otherwise. The terms "comprises" and/or "comprising," when used in this specification, specify the presence of the stated features, integers, steps, operations, elements, and/or components, but do not preclude the presence or addition of one or more other features, integers, steps, operations, elements, and/or components.

With regard to the preceding description, it is to be understood that changes may be made in detail, especially in matters of the construction materials employed and the shape, size, and arrangement of parts without departing from the scope of the present disclosure. This specification and the embodiments described are exemplary only, with the true scope and spirit of the disclosure being indicated by the claims that follow.

What is claimed is:

1. A testing system for testing integrated circuit devices with at least one radio frequency (RF) antenna, comprising:
an alignment plate for receiving a device under test (DUT) having at least one RF transmitting antenna;
a receiving antenna;
an enclosure surrounding but separated from the transmitting antenna, the enclosure including:
a. a first static part;
b. a second movable part, said second part including a receptacle for the receiving antenna;
c. said second part being telescopically movable along an axis generally orthogonal to said DUT, so that a distance between the DUT and the second part can be increased or decreased; and
the receiving antenna being in the enclosure,
whereby a distance between the DUT and receiving antenna is adjustable;
further including a conversion circuit connected to the receiving antenna,
wherein the conversion circuit is configured to convert an RF output from the DUT to a direct current (DC) voltage, whereby the DC voltage is used as a proxy for the RF output to test the DUT.

2. The system according to claim 1, wherein the second part of said enclosure surrounds, at least in part, said first part of said enclosure.

3. The system according to claim 1, wherein said receptacle includes a pair of spaced apart slots in said second part of said enclosure, and wherein said receiving antenna includes a substrate of width sized to be receivable in said slots.

4. The system according to claim 1, wherein said receiving antenna includes an electrically conductive trace on a substrate.

5. The system according to claim 4, wherein said trace include severable portions which can be electrically disconnected from other portions of the trace to change the frequency response of the receiving antenna.

6. A testing system for testing integrated circuit devices with at least one radio frequency (RF) antenna, comprising:
an alignment plate for receiving a device under test (DUT) having at least one RF transmitting antenna;
a receiving antenna;
an enclosure surrounding but separated from the transmitting antenna, the enclosure including:
a. a first static part;
b. a second movable part, said second part including a receptacle for the receiving antenna;
c. said second part being telescopically movable along an axis generally orthogonal to said DUT, so that a distance between the DUT and the second part can be increased or decreased; and
the receiving antenna being in the enclosure,
whereby a distance between the DUT and receiving antenna is adjustable; and
wherein the enclosure has four side surfaces, each side surface of the enclosure has a slotted opening, each slotted opening houses the receiving antenna.

7. A testing system for testing integrated circuit devices having top, bottom and edge surfaces with corners at the intersection of said edges surfaces, with at least one radio frequency (RF) antenna mounted on one of the edge surfaces, comprising:
an alignment plate for receiving a device under test (DUT) having at least one RF transmitting antenna mounted on an edge surface;
a receiving antenna;
a DUT retainer device, said device including:
a plurality of corner retainers for engaging at least two corners of the DUT; said corner retainers defining a gap, said gap being aligned with said RF transmitting antenna;
a generally planar portion adjacent said gap, said planar portion including at least one slot for receiving said receiving antenna;
further including a conversion circuit connected to the receiving antenna,
wherein the conversion circuit is configured to convert an RF output from the DUT to a direct current (DC) voltage, whereby the DC voltage is used as a proxy for the RF output to test the DUT, and
wherein the conversion circuit includes a low-noise amplifier and an RF detector.

8. The system of claim 7, wherein said at least one slot includes a plurality of spaced apart slots of different distances from said RF transmitting antenna on the DUT, and wherein said receiving antenna is sized to fit into any of the slots.

9. The system according to claim 8, wherein the slots are collinearly aligned.

10. The system according to claim 7, wherein the low-noise amplifier is configured to electrically connect to the receiving antenna,
the low-noise amplifier is further configured to amplify the RF output from the DUT received by the receiving antenna;
the RF detector is configured to electrically connect to the low-noise amplifier,
the RF detector is further configured to convert the amplified RF output to a DC voltage.

11. The system according to claim 7, wherein the conversion circuit further includes a filter,
the filter is configured to electrically connect to the low-noise amplifier and the RF detector,
the filter is disposed between the low-noise amplifier and the RF detector in the conversion circuit,
the filter is configured to filter noise in the amplified RF output.

* * * * *